(12) United States Patent
Morita et al.

(10) Patent No.: US 7,528,485 B2
(45) Date of Patent: May 5, 2009

(54) SEMICONDUCTOR DEVICE, POWER CONVERTER DEVICE USING IT, AND HYBRID VEHICLE USING THE POWER CONVERTER DEVICE

(75) Inventors: Toshiaki Morita, Hitachi (JP); Hiroshi Hozoji, Hitachiota (JP); Kazuhiro Suzuki, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/191,942

(22) Filed: Jul. 29, 2005

(65) Prior Publication Data
US 2006/0022326 A1 Feb. 2, 2006

(30) Foreign Application Priority Data
Jul. 29, 2004 (JP) ............................. 2004-221918

(51) Int. Cl.
*H01L 23/48* (2006.01)
*H01L 23/52* (2006.01)
*H01L 23/40* (2006.01)

(52) U.S. Cl. ............................ 257/735; 257/E23.014
(58) Field of Classification Search ................. 257/690, 257/691, 692, 762, 765, 262, 735, 734, 666, 257/E23.014
See application file for complete search history.

(56) References Cited

U.S. PATENT DOCUMENTS 5,132,776 A * 7/1992 Hanada et al. .............. 257/729
6,589,859 B2 * 7/2003 Petitbon et al. ............. 438/611
6,853,074 B2 * 2/2005 Kitae et al. ................. 257/730
2004/0217472 A1 * 11/2004 Aisenbrey et al. ........... 257/734

FOREIGN PATENT DOCUMENTS

| JP | 2000-183249 | 6/2000 |
|---|---|---|
| JP | 2002-126869 | 5/2002 |
| JP | 2004-25196 | 1/2004 |
| JP | 2004-107728 | 4/2004 |
| JP | 2004-128357 | 4/2004 |
| JP | 2004-130371 | 4/2004 |
| JP | 2004-146695 | 5/2004 |
| JP | 2005-136375 | 5/2005 |

OTHER PUBLICATIONS

U.S. Appl. No. 10/996,038.

* cited by examiner

*Primary Examiner*—David A Zarneke
*Assistant Examiner*—Jenny L Wagner
(74) *Attorney, Agent, or Firm*—Antonelli, Terry, Stout & Kraus, LLP.

(57) ABSTRACT

A semiconductor device which uses a semiconductor element having main current input/output electrodes, one and the other of which are extended up to a one surface and a remaining surface of a semiconductor chip respectively for causing one of the input/output electrodes to be contacted with a conductive layer of a insulating substrate, whereby the semiconductor element is supported on or above the insulating substrate. A conductive strip which is made of a composite material of carbon and aluminum or a composite material of carbon and copper is used for connection between the remaining input/output electrode of the semiconductor chip and the conductive layer of the insulating substrate.

8 Claims, 8 Drawing Sheets

CROSS-SECTIONAL VIEW
AT A-A' OF FIG.3A

EXAMPLE OF CONTACT
CROSS-SECTION WITHOUT
PRESSURIZATION

EXAMPLE OF CONTACT
CROSS-SECTION WITH
PRESSURIZATION

SEMICONDUCTOR DEVICE, POWER CONVERTER DEVICE USING IT, AND HYBRID VEHICLE USING THE POWER CONVERTER DEVICE

CROSS-REFERENCE TO RELATED APPLICATION

The present application relates to subject matters described in a co-pending patent application Ser. No. 10/996,038 filed on Nov. 24, 2004 entitled "ELECTRIC PART MOUNTING METHOD, SEMICONDUCTOR MODULE, AND SEMICONDUCTOR DEVICE" and assigned to the assignees of the present application. The disclosures of this co-pending application are incorporated herein by reference.

BACKGROUND OF THE INVENTION

The present invention relates to semiconductor devices with relatively large power capacities and, more particularly, to a semiconductor device capable of offering enhanced performances even in high temperature environments, such as within an engine room or the like. This invention also relates to an electrical power converting device using the semiconductor device along with a hybrid vehicle using this power converter.

In recent years, from standpoints of energy conservation and environmental pollution, the so-called hybrid vehicles which employ both an internal combustion engine and an electric motor and which gain the travelling drive power depending upon these both power sources and electrically powered vehicles whose travelling drive power depends on an electric motor alone attract the attention of people and are currently reduced to practice. In this case, alternate current (AC) motors, such as induction motors or synchronous motors, are often used as the electric motors, because of their merits such as high control efficiency and simplified structures.

Rechargeable batteries or capacitors are typically used as the power source in the case of hybrid vehicles. In the case of electrically powered vehicles, fuel cells are used in most cases. In any case, a conversion device for converting direct current (DC) power into AC power is required, which is called the inverter device. For this inverter, power semiconductor devices are used.

Incidentally, in the case of this power semiconductor device, aluminum wires are typically used for electrical connection between a semiconductor chip and external electrodes disposed at the periphery thereof. At this time, in high temperature environments, a problem occurs as to the cracking at contact portions of the power semiconductor chip and its associated bonding wires due to a difference in thermal expansion between the aluminum and silicon.

To prevent such cracking at the contact portions of this power semiconductor chip and the bond wires, a structure is known which uses a conductive resin material to adhere bus bar wires with a low thermal expansion material bonded thereto to upper face electrodes of power semiconductor elements (for example, see JP-A-2000-183249).

SUMMARY OF THE INVENTION

It is unlikely that the above-noted prior art is designed to retain the reliability in high temperature environments. Thus, problems have arisen as to a limit to applicable objects.

For example, in the case of the above-stated vehicles, an engine and its nearby parts are in high temperature environments. Thus, when applied thereto, the prior art must be faced with reliability problems for the reasons presented below.

First, in the case of the prior art, when exposed to high temperatures, the temperature of a semiconductor element rises up to the glass-transition temperature of a conductive resin material or therearound. This temperature riseup causes the resin material to become softer, resulting in contact portions being weaker against stresses. Thus, a need is felt to reduce heat generation to thereby suppress such temperature riseup of the power semiconductor element. However, this is difficult because the conductive resin material is inherently large in electrical resistance.

For example, the conductive resin material is as large as 1 $\Omega \cdot cm$ in volume resistivity, which is approximately seventy thousand times greater than the volume resistivity, about 15 $\mu\Omega \cdot cm$, of tin-lead eutectic soldering material that is often used as bonding material. Accordingly, it remains difficult to reduce the amount of heat generation due to electrical conduction.

Alternatively, in a structure with low thermal expansion material being adhered to a bus bar wire made of copper, due to a difference between their thermal expansion coefficients, the bus bar wire thermally extends at high temperatures to an extent greater than the lower thermal expansion material while much shrinking at low temperatures. This phenomenon becomes more noticeable in high temperature environments. Hence, the structure stated above is such that the bus bar wire can deform into an arch-like shape.

In other words, in the case of prior art techniques, the force in a direction that tears off the bus bar wire from the power semiconductor element occurs recurrently due to cycles of drive and stop (halt) of a motorcar. This results in the peel-off of contact portions becoming readily occurrable, which leads to a decrease in reliability.

Furthermore, as previously stated, whenever the bus bar wire is deformed into an arch-like shape, a power semiconductor element connected thereto also experiences stress application and, for this reason, behaves to deform into an arch-like shape in a similar way. At this time, since the power semiconductor element is contacted with and adhered to a insulating substrate by a readily plastically deformable material, such as soldering material shown in the prior art also, the force in the direction that tears off is also applied to a contact portion(s) of the power semiconductor element and the insulating substrate in a similar way to the case stated above. This makes it difficult to provide the long-term reliability in high temperature environments.

It is an object of this invention to provide a power semiconductor device capable of retaining its long-term reliability even in high temperature environments.

The foregoing object is achieved by providing a semiconductor device which uses more than one semiconductor element having main current input/output electrodes with one and the other thereof being taken up to a one surface and the other surface of a semiconductor chip respectively for causing one of the input/output electrodes to be contacted with a conductive layer of a insulating substrate whereby the semiconductor element is supported on or above the insulating substrate, wherein a conductive strip made of either a composite material of carbon and aluminum or a compound material of carbon and copper is used for connection between the other input/output electrode of the semiconductor chip and the conductive layer of the insulating substrate.

The above-noted object is also achieved by arranging the semiconductor device so that the conductive strip is connected to the other input/output electrode of the semiconductor chip and the conductive layer of the insulating substrate by a contact layer of a mixture of more than one kind of metal particles as selected from the group consisting of gold, silver, nickel, copper, aluminum, zinc, tin, indium, bismuth and antimony.

Additionally, the object is also achieved by arranging the device so that one of the input/output electrodes is in contact with the conductive layer of the insulating substrate by a contact layer of a mixture of more than one kind of metal particles as selected from the group consisting of gold, silver, nickel, copper, aluminum, zinc, tin, indium, bismuth and antimony.

Furthermore, the object is also achieved by arranging the device so that the conductive strip has a contact surface covered with gold or silver, or alternatively arranging it so that the contact surface of one of the input/output electrodes and the contact surface of the conductive layer of the insulating substrate are covered with gold or silver.

In accordance with the invention, it is possible to improve the long-term reliability of contact portions of semiconductor elements with respect to high temperature environments.

In addition, according to the invention, it is possible to improve heat release/radiation capabilities of the semiconductor elements. While in the semiconductor device a power semiconductor element for performing current switching operations is the component that becomes the highest temperature, it is possible for the invention to lower, by the improvement of the heat releasability, a temperature of more than one contact portion between a hybrid wiring board and the power semiconductor element, when compared to a case where prior known wires are directly connected to the power semiconductor element.

The temperature decrease of the contact portion means reduction of thermal expansion at such portion. Thus, according to the invention, it is possible to improve the long-term reliability in comparison with the case where wires are in direct contact with the power semiconductor element.

Additionally, the semiconductor device of this invention may be applied to a power conversion device for use in hybrid vehicles. At this time, the power converter is mountable at locations of high temperature environments. This makes it possible to provide a power converter device capable of acquiring long-term reliability without having any dedicated cooling machine.

These and other objects, features and advantages of this invention will become apparent from the following more particular description of currently preferred embodiments of the invention, as illustrated in the accompanying drawings.

DESCRIPTION OF THE EMBODIMENTS

A power semiconductor device in accordance with an illustrative embodiment of this invention will be explained in detail below.

Figure 3A:
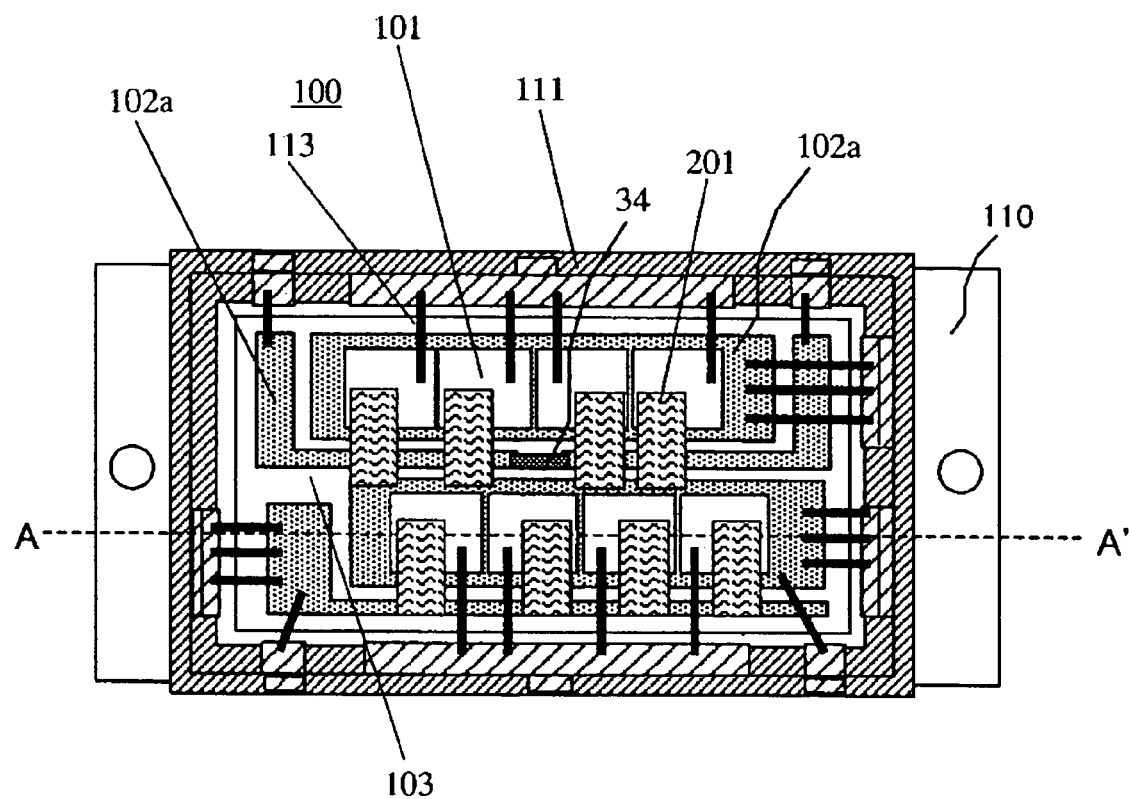
FIG. 3A is a plan view diagram showing one embodiment of the power semiconductor device in accordance with the invention.
Figure 3B:
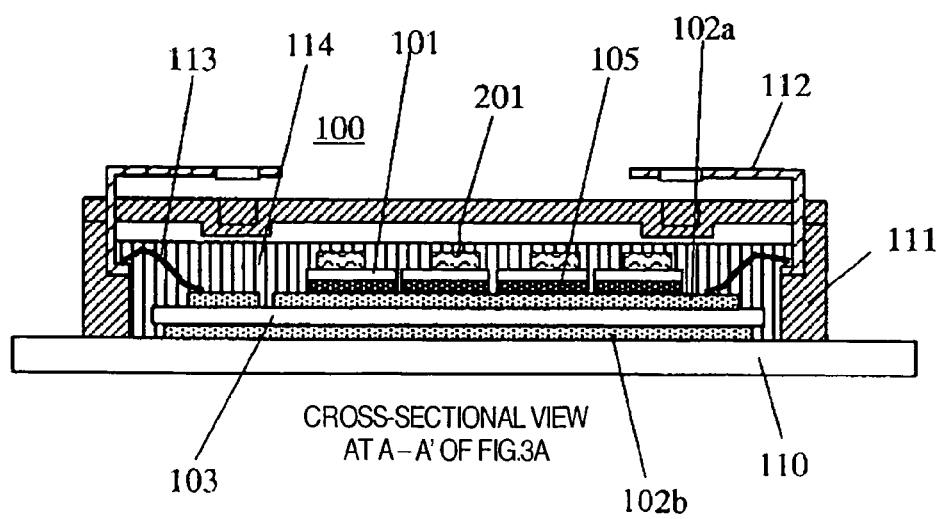
FIG. 3B is a side sectional view thereof taken along the line A-A' of FIG. 3A.
Figure 4:
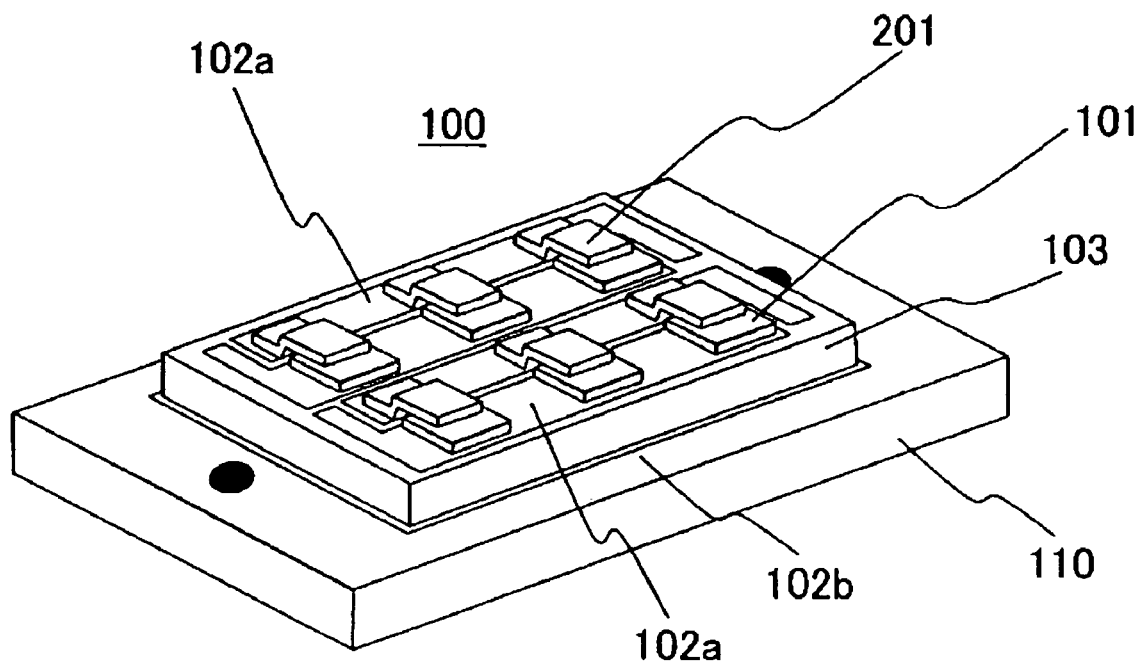
FIG. 4 is a perspective view of main part of one embodiment of the power semiconductor device in accordance with the invention.

FIGS. 3A-3B and 4 depict one embodiment in case the invention is applied to an insulated type power semiconductor device for use in an inverter device, wherein FIG. 3A is a plan view, FIG. 3B is a sectional view along the line A-A' of FIG. 3A, and FIG. 4 is a perspective view. In these drawings, reference numeral 101 designates semiconductor elements; 102a and 102b denote conductive layers; 103 indicates a ceramics insulating substrate; 110 is a supporting member; 111, a case; 112, external terminals; 113, bonding wires; 114, a sealing material. Additionally, the power semiconductor device per se is indicated by numeral 100.

Note here that the support member 110 is made up of a copper plate or an aluminum plate and is arranged to function as a member for supporting an entirety while also functioning as a heat conduction path when attached to heat release fins (not shown). And, at one surface (an upper surface in the drawing) of this support member 110, a ceramics insulating substrate 103 is soldered in a way as illustrated herein.

This ceramics insulating substrate 103 is made of silicon nitride-based ceramic material and is designed to have a three-layer structure with conductive layers 102a and 102b made of copper being formed on its both surfaces. At this time, an electrical wiring pattern is formed in the conductive layer 102a residing on one surface (upside face in the drawing) so that a wiring board is structured. And, the conductive layer 102b on the other surface (downside face in the drawing) is for use as a junction or contact plane when soldering the ceramics insulating substrate 103 to the support member 110.

The semiconductor elements 101 are mounted at specified portions of the wiring pattern that is formed of this conductive layer 102. Here, insulated gate bipolar transistors (IGBTs) are used as the semiconductor elements 101. The IGBTs as used herein are of the type having a main current input electrode (for example, emitter) and a main current output electrode (e.g., collector), which are taken out onto one surface and the other surface of a semiconductor chip, respectively.

The semiconductor elements 101 are not limited to the above-noted IGBTs. Metal oxide semiconductor field effect transistors (MOSFETs) may alternatively be used. In this case, the main current input electrode becomes a source as an example, while the output electrode is a drain, for example.

Figure 5:
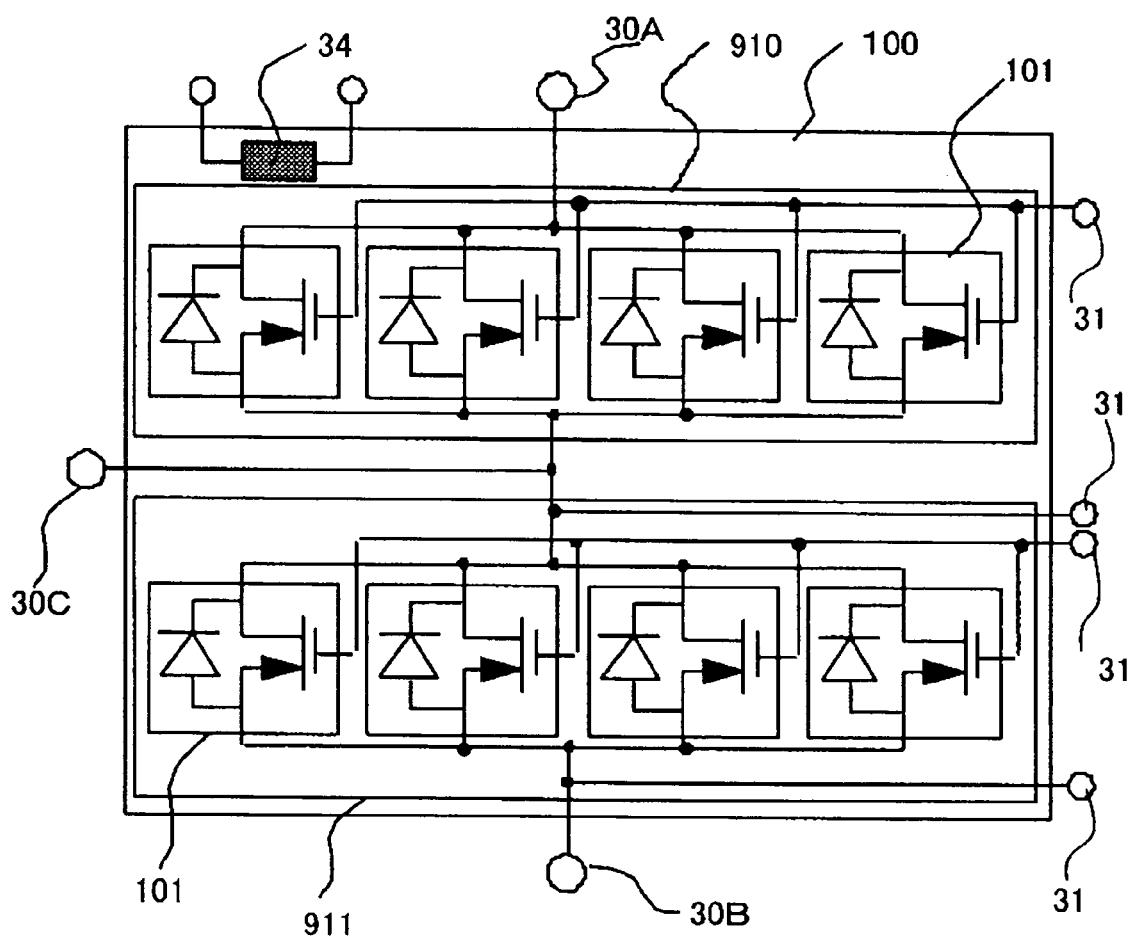
FIG. 5 is an equivalent circuit diagram of one embodiment of the power semiconductor device in accordance with the invention.

This power semiconductor device 100 constitutes a circuit corresponding to a single arm part in main circuitry of the inverter device as shown in FIG. 5. At this time, each of an upper arm part 910 and a lower arm part 911 is made up of four semiconductor elements 101 of IGBTs. Note that in FIG. 4, a case of using three semiconductor elements 101 is illustrated for brevity purposes.

A flywheel diode is connected in anti-parallel to each IGBT of the semiconductor elements 101 as shown in the drawing, which has two DC terminals 30A and 30B on the positive and negative polarity sides along with a single AC output terminal 30C and four auxiliary terminals 31; furthermore, a thermistor 34 used for temperature detection is also provided inside of it. Here, the DC terminals 30A-30B and AC output terminal 30C are formed of external terminals 112.

Figure 6:
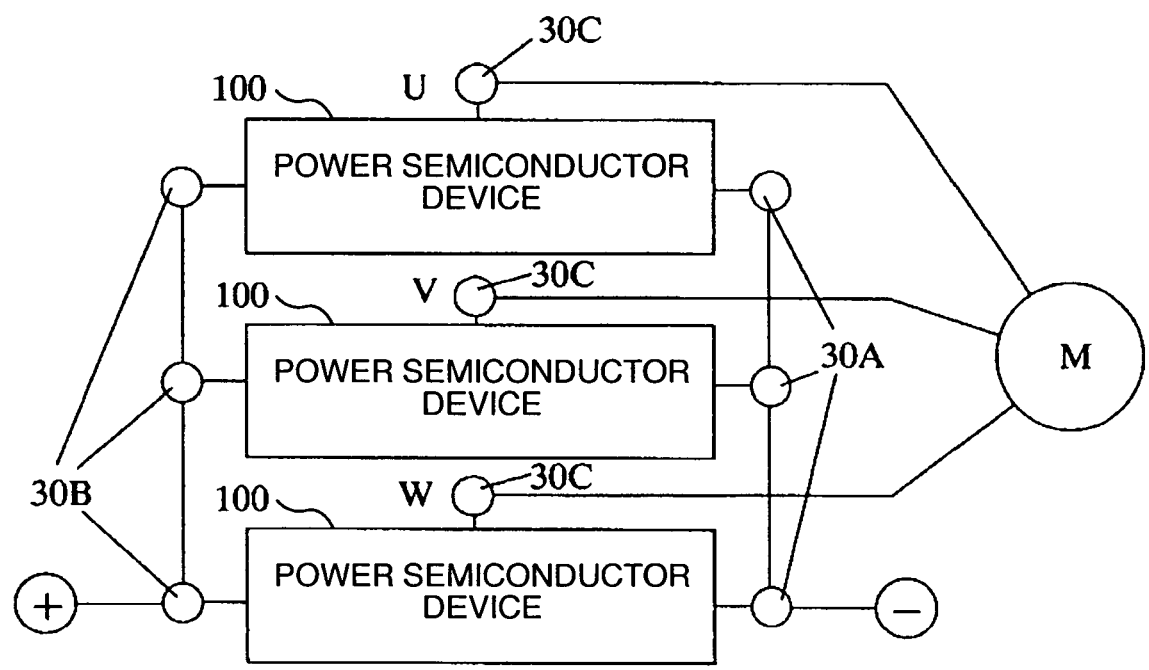
FIG. 6 is an explanation diagram of an inverter device which incorporates one embodiment of the power semiconductor device in accordance with the invention.

Three power semiconductor devices each similar to the device 100 are connected together as shown in FIG. 6 so that main circuitry of three-phase inverter device is constituted. By a control means (not shown), the circuitry is subjected for example to pulse width modulation (PWM) switching control to thereby convert DC power being supplied to the DC terminals 30A-30B into AC power which is variable in voltage and in frequency and which consists of three phases, i.e., U phase, V phase and W phase. The AC power converted is then output from the output terminal 30C, thereby enabling it to be supplied to an AC motor M, such as an induction motor.

Figure 1:
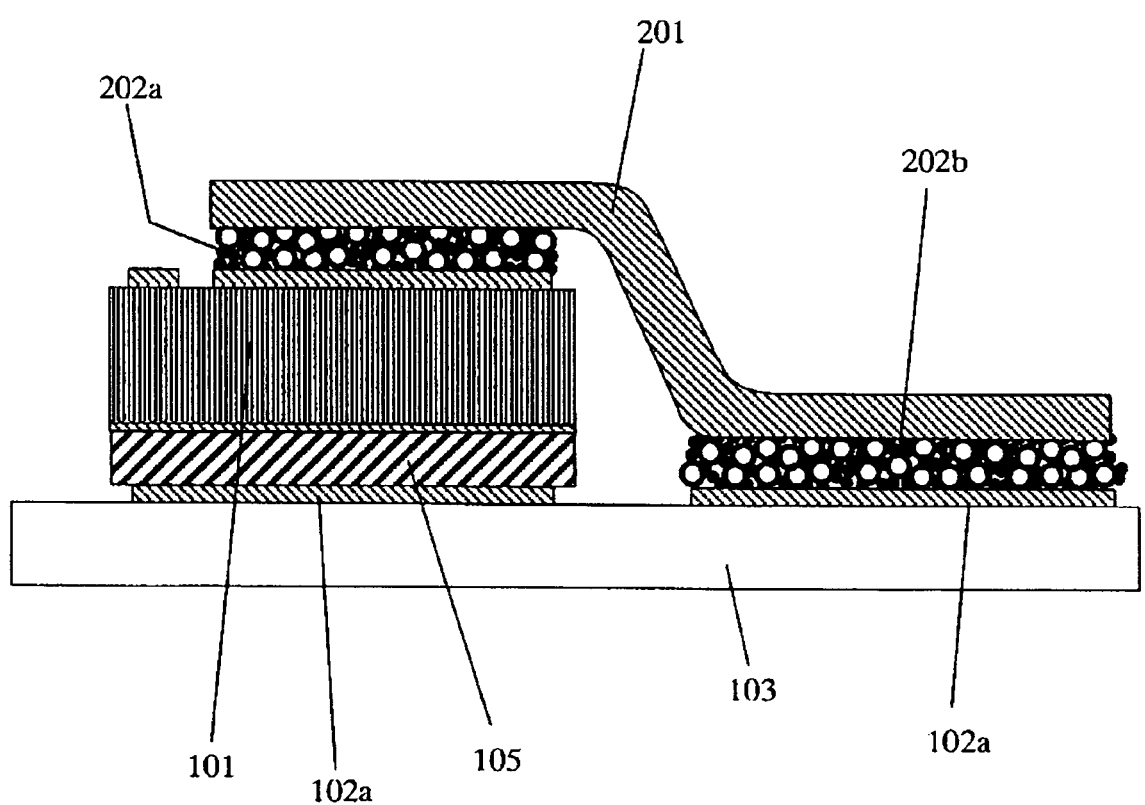
FIG. 1 is a partially enlarged cross-sectional diagram showing one embodiment of the power semiconductor device in accordance with the present invention.

Turning back to FIGS. 3A-3B and 4, although in these drawings each semiconductor element 101 is mounted at a specified portion of the conductive layer 102a that forms the wiring pattern as stated previously, one practical implementation at this time is as follows: as shown in FIG. 1, the main current input electrode (or output electrode) of each semiconductor element 101 residing on its downside surface is attached to a certain portion of the conductive layer 102a that forms the wiring pattern while being soldered and contacted thereto by a tin-based soldering material 105.

On the other hand, the main current output electrode (or input electrode) of each semiconductor element 101 residing on its upside surface is connected to a specified portion of the conductive layer 102a that forms the wiring pattern by a conductive strip-shaped pad 201 for the connection use. At this time, in this embodiment, in order to make it possible to reduce the thermal expansion coefficient while retaining electrical conductivity, this conductive strip 201 as used herein is made of either a composite material of carbon and aluminum or a composite of carbon and copper, with nickel plating being applied thereto.

Furthermore, in this embodiment, as shown in FIG. 1, this conductive strip 201 and the output electrode (or input electrode) of a semiconductor element 101 are contacted or bonded by a contact layer 202a of an admixture of components that mainly contain gold particles and silver particles of the so-called nano-size and micron size having ultrafine particle diameters ranging from 5 nm to several tens of μm. Similarly, the conductive strip 201 and the conductive layer 102a also are bonded by a contact layer 202b of a mixture of main components of gold particles and silver particles of the nano-size and micron size ranging from 5 nm to several tens of μm.

These contact layers 202a-202b are formed in a way which follows. Firstly, gold plating is applied to those portions that become contact faces of respective ones of the output electrode (or input electrode) of semiconductor element 101 and the conductive layer 102a plus the conductive strip 201. Then, deposit a liquid solution containing therein a mixture of the above-noted gold particles and silver particles of the nano-size and micron size onto those portions that become the contact faces at a surface of the output electrode (or input electrode) of the semiconductor element 101 and a surface of the conductive layer 102a. Thereafter, remove the solution, causing the mixture to remain. This results in a mixture layer being formed to a predetermined thickness.

Thereafter, the conductive strip 201 which was patterned to have a prespecified shape is mounted on both the contact faces of the output electrode (or input electrode) of semiconductor element 101 and the conductive layer 102a, and is then heated up for about 60 minutes in an atmosphere of a temperature of 80° C.

By this heating, the gold particles and silver particles of the nano-size and micron size which constitute the mixture layer are melted and solidified together while the conductive strip 201 is fixed and bonded by the contact layer 202a to the output electrode (or input electrode) of semiconductor element 101 and also bonded by the contact layer 202b to the conductive layer 102a, respectively, in a similar manner to the soldering. Electrical connection is thus obtained with the conductive strip 201 as an electrical lead wire.

The gold and silver form an all-ratio solid solution. By letting it contain the nano-size particles and micron-size particles, it is possible to form the solid solution even at a low temperature of about 80° C. to thereby enable achievement of adhesion similar to that obtained by soldering.

The solid solution state of the gold and silver at this time is a phenomenon unique to the nano-size particles. Unlike an aggregation body in which each particle is present independently, mechanical adhesion is given as stated supra. This is obtainable only by heatup at a temperature of 80° C.

Also importantly, once the adhesion is given in this way, the contact layer 202a, 202b has its nature which follows: even though the heatup temperature during bonding was set at 80° C., the solid solution state hardly disappears thereafter until the melting point in the mixture material reaches a lower temperature—in this case, an ordinary melting temperature of the silver—and thus retains the adhesion state. Accordingly, there are no risks as to occurrence of a problem relating to the heat resistance properties of bonded portions.

Consequently, it can be seen that according to this embodiment, low-temperature processing is enabled so that the risk of being exposed to high temperatures at the time of manufacturing is lessened while enabling resultant products to offer an ability to withstand high temperature usage, resulting in obtainment of improvements in long-term reliability.

Figure 2:
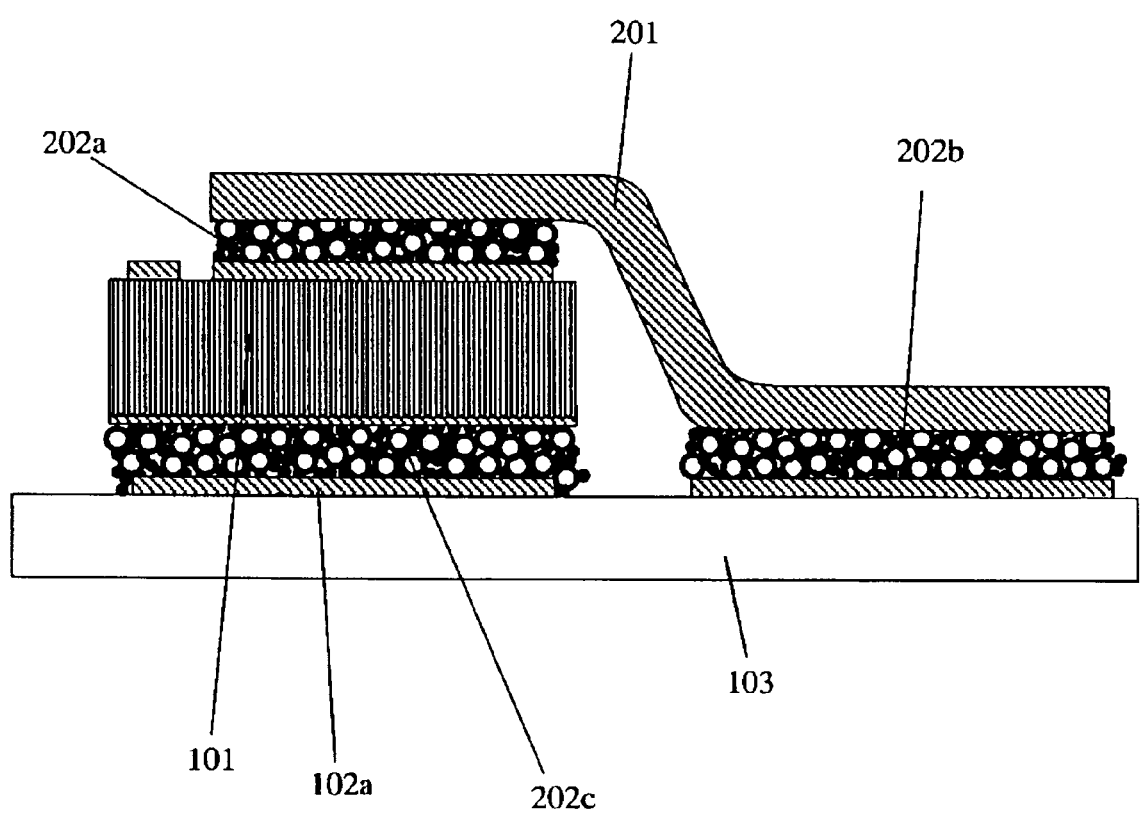
FIG. 2 is a partly enlarged sectional diagram showing another embodiment of the power semiconductor device in accordance with this invention.

See FIG. 2, which shows an embodiment in a case where the tin-based solder material 105 is not used for adhesion with respect to the conductive layer 102a of a semiconductor element 101; alternatively, a contact layer 202c is used, which is comprised of a mixture material containing as its main components gold particles and silver particles of the nano-size and micron size ranging from 5 nm to several tens of μm in the same manner as the contact layer 202a, 202b. The other points are the same as those in the case of FIG. 1.

Consequentially, necessary processing is performed thereafter, such as electrical connection using bonding wires 113, sealing by a seal material 114 and others. This makes it possible to complete the power semiconductor device 100 in either case of FIG. 1 and FIG. 2.

Obviously, by taking into consideration the fact that the device is applied to a vehicle and is used in a high temperature environment near or around an engine, certain materials with heat resistance properties are used for respective parts making up the power semiconductor device 100, such as the case 111 and the seal material 114 or else.

Note here that in such the power semiconductor device, a large current flows in not only the collector electrodes of semiconductor elements but also emitter electrode portions thereof. At this time, in the power semiconductor device 100 in accordance with this embodiment, conductive strips 201 with a large wiring width are used in either case of FIG. 1 and FIG. 2 while letting each strip be bonded by the contact layers

202a and 202b. Thus it is possible to further improve the connection reliability on the emitter electrode side.

Explaining in greater detail, the contact layers 202a-202b are current-flowable parts so that high electrical conductivity material of a mixture of nano-size particles and micron-size particles with the gold and silver as its main components is used for the material thereof.

Although the adhesion due to this mixture material of the gold particles and silver particles is obtained at a temperature of about 80° C., the both go into a mutually solid-solved state even at such temperature of about 80° C. This is different from a mere aggregation in which each particle exists separately.

While the gold and the silver form at this time the all-ratio solid solution as stated previously, letting it contain nano-size particles makes it possible to form the solid solution even at a low temperature of about 80° C., resulting in the adhesion being obtained.

It is noted here that although in this embodiment the mixture of gold particles and silver particles of the nano-size and micron size as its main components is used for the contact layer 202a and contact layer 202b, this mixture is not limited to the gold and silver. Other implementable examples of this mixture are admixtures of more than one kind of metal particles as selected from the group consisting essentially of gold, silver, nickel, copper, aluminum, zinc, tin, indium, bismuth and antimony.

Figure 7:
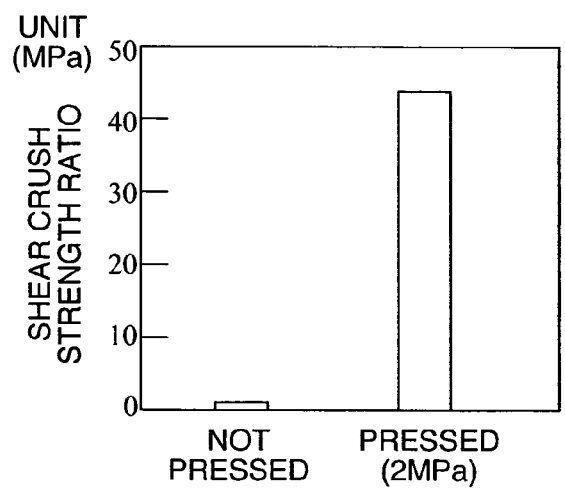
FIG. 7 is a diagram showing the shearing breakdown strength of a contact layer made of an admixture of metal particles.
Figure 8A:
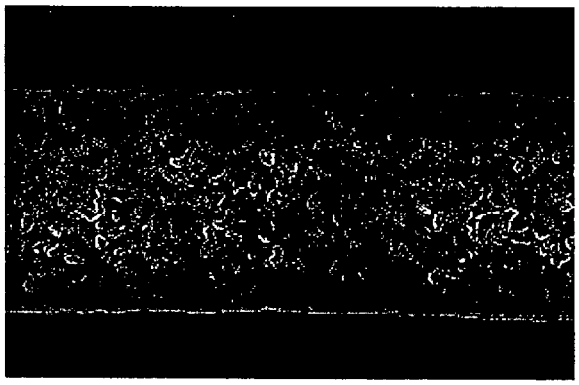
FIGS. 8A and 8B are diagrams each showing a sectional view of a contact layer made of a metal particle mixture.
Figure 8B:
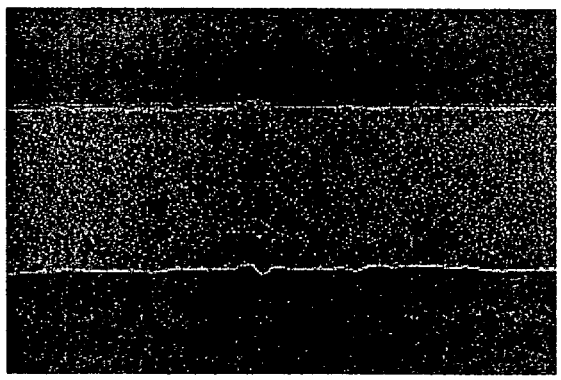

In the case of using a contact layer containing metal particles as its main component, it is preferable from a viewpoint of adhesion strength that both heatup and pressurization be used for adhesion, although one specific example that adheres or bonds it by heating was explained. Below is an explanation as to a difference in shear crush strength of contact portions between the case of non-pressurization during adhesion and the case of pressurization. See FIG. 7, which shows the shear crush strength of a contact portion in the case of non-pressurization and that in the case of pressurization with a pressure of 2 MPa while using for the contact layer the gold particles with an average particle diameter of 10 nm. Regarding contact/adhesion methodology, a method similar to the above-described method was used, except for the presence or absence of pressurization. Here, the shear crush strength is such that a shear crush testing machine is used to measure a maximal load at the time the contact portion is destroyed. As apparent from FIG. 7, it can be seen that in the case of co-use of the pressurization, the resulting shear crush strength is higher by a factor of several tens than that in the case of non-pressurization. A scanning electron microscope (SEM) image of a cross-section of the contact portion at this time is shown in FIG. 8A. It is understandable that in the contact portion cross-section shown in FIG. 8A upon application of no pressures, a great number of gaps are present therein, rather than a structure with metal particles being completely cohered together. On the contrary, in a contact portion cross-section upon pressurization shown in FIG. 8B, it is seen that this is a structure with metal particles congested together.

Figure 9:
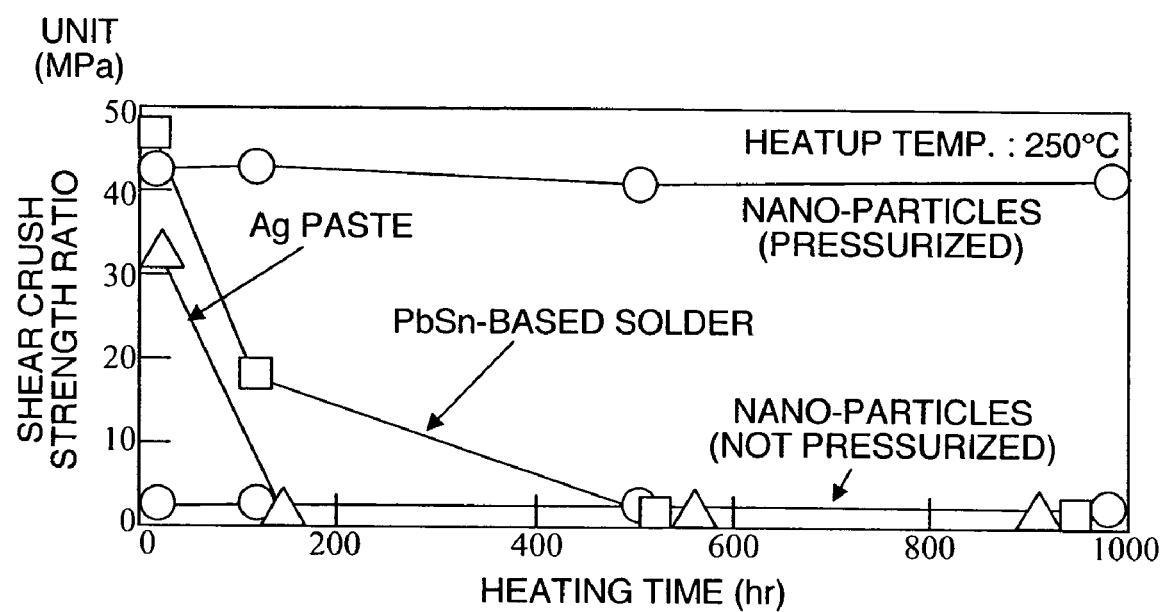
FIG. 9 is a diagram showing high temperature leave-to-stand characteristics of contact layers.

Next, a shear crush strength relative to an aging time when being left under heat application of 250° C. was measured as high temperature leave-to-stand characteristics. FIG. 9 shows respective measurement results of a contact layer made of an admixture of gold particles (for non-pressurization and pressurization), a contact layer of PbSn-based solder material, and a contact layer of Ag paste. From the results of FIG. 9, it can be seen that the PbSn-based solder contact layer and the Ag paste contact layer exhibit an appreciable decrease in shear crush strength relative to the initial strength thereof with the elapse of a high temperature aging time. Regarding the PbSn-based solder material, its shear crush strength becomes almost zero after it is left for 500 hours. Additionally, the Ag paste is such that its shear crush strength becomes almost zero after it is left for 168 hours. In contrast, it is seen that the contact layer made of the mixture of gold particles is such that degradation of shear crush strength with respect to the initial strength stays less even after the elapse of more than 600 hours under heat application thereto, at the time of pressurization and also at the time of non-pressurization. From this fact also, it is appreciated that the contact layer made of the mixture of gold particles is excellent in high temperature aging characteristics.

The conductive strip 201 is made of either a composite material of carbon and aluminum or a composite material of carbon and copper as stated previously. Hence, the thermal expansion coefficient of this conductive strip 201 is about 8 to 12 ppm/° C.

On the other hand, the semiconductor element 101 is contacted and bonded to the conductive layer 102a by the tin-based solder material 105. At this time, the conductive layer 102a and conductive layer 102b are made of copper, whereas the ceramic insulating substrate 103 is made of silicon nitride-based ceramics. At this time, the conductive layer 102a was designed to have a thickness of 1.0 mm; the conductive layer 102b has a thickness of 0.8 mm; and, the ceramic insulating substrate 103 is 0.32 mm thick. In this case, the thermal expansion coefficient of a dielectric wiring substrate made up of the conductive layers 102a-102b and the ceramic insulating substrate 103 is about 10 ppm/° C.

With such the settings, this embodiment is regarded so that the power semiconductor device 100 is sandwiched between those members with almost the same thermal expansion coefficient—that is, the dielectric wiring substrate with its thermal expansion coefficient of 10 ppm/° C. and the conductive strip 201 with a thermal expansion coefficient of 8 to 12 ppm/° C. Thus it is possible to lessen thermal stresses occurring due to a difference in expansion between respective members, which becomes noticeable in high temperature environments, in spite of the fact that the conductive strip 201 with a relatively large sectional area is used for connection.

Ideally, the thermal expansion coefficient of the conductive strip 201 is made identical to that of the dielectric wiring substrate whereby the thermal stresses appearing in the contact layer 202b becomes minimized so that the long-term reliability can be maximally improved. According to the above-noted embodiment, the thermal expansion coefficients are 10 ppm/° C. and 8 to 12 ppm/° C. Thus it can be seen that an almost ideal state is obtained.

Although the above-stated dielectric wiring substrate's thermal expansion coefficient is one example as calculated using practical values, the thermal expansion coefficient must have an optimal range determinable from the material used for the insulating substrate and the range of its thickness, so it is arbitrarily selectable.

While the foregoing explanation is under an assumption that each component remains flat even upon occurrence of thermal expansion, this embodiment is designed at this time to use the conductive strip 201 for connection purposes so that arch-like deformation hardly takes place even in the case of thermal expansion. Accordingly, as previously stated as the assumption, it is possible to allow the contact plane with the power semiconductor element 101 to remain flat.

Next, an explanation will be given of the reliability of a contact portion of the conductive strip 201 and the power semiconductor element 101 in the above-noted embodiment. In the case of the conductive strip 201 made of the composite material as employed in the embodiment above, its thermal conductivity is as large as about 300 W/m° C. (reference value: copper's heat conductivity is 380 W/m° C., aluminum's heat conductivity is 233 W/m° C.). Also importantly, this is designed to have a strip-like shape (resembling in shape a thin rectangular piece), rather than a mere wire-like shape.

As a result of this, it is possible to enlarge the cross-sectional area of conductive strip 201. In combination with the above-noted feature of high heat conductivity, the heat transfer from the power semiconductor element 101 becomes easier. Thus, according to this embodiment, it is possible to improve the heat releasability of the power semiconductor element 101.

For example, in the case of a power semiconductor device for use in inverter devices, a power semiconductor element which performs current switching operations is the component that generates a maximal amount of heat and thus becomes high temperatures. According to this embodiment, the improvement in heat releasability owing to the conductive strip 201 makes it possible to lower the temperature of a contact portion of the power semiconductor element 101, when compared to the case of prior known power semiconductor devices using wire bonding techniques.

Note here that the temperature reduction of a contact portion means a decrease in thermal expansion at such portion. Hence, this indicates that the long-term reliability improves when compared to the case of directly connecting wires to power semiconductor elements. Thus it can be seen that according to this embodiment, an improvement of the long-term reliability is obtainable.

The embodiment of this invention is not exclusively limited to designs using IGBTs and/or MOSFETs as the power semiconductor elements in the way stated supra. Those semiconductor elements of the type having electrodes with two upper and lower faces for main current inlet and outlet are also applicable in a similar way.

The semiconductor device of this invention is applicable to various types of power converter devices. Applying this semiconductor device to such power converters makes it possible to provide a power converter device capable of being installed at locations in high temperature environments and also capable of offering enhanced long-term reliability without having any coolers for exclusive use.

It is also possible for the inverter device and electric motor to be built in electrically powered vehicles as its power source. In this electric vehicle (EV), it was possible to simplify a drive mechanism spanning from the power source up to wheels; thus, shocks occurring in speed change events are lessened when compared to prior art vehicles that are designed to shift transmission by changing a transmission gear ratio, thereby enabling achievement of smooth shifting. It is also possible to reduce unwanted vibrations and noisy sounds to an extent lower than the prior art.

The power semiconductor device 100 in accordance with the embodiment of this invention is employable for an inverter device for control of the revolution speed an electric motor of hybrid vehicles as stated previously. In this case, the three-phase inverter device shown in FIG. 6 is employable, which has an ability to supply three-phase AC power variable in voltage and in frequency from an engine-driving power generator and a rechargeable battery module to the AC motor M of a hybrid vehicle.

The inverter device containing the power semiconductor device 100 in accordance with the embodiment of the invention is also incorporated into air conditioning machinery. In this case, it is possible to obtain higher efficiency than that in the case of using prior art AC motors.

Therefore, the embodiment of the invention is useful for reduction of power consumption during the use of an air conditioner. It is also possible to shorten a time taken during the room temperature reaches a setup temperature from operation startup to an extent less than the case of using prior art AC motors.

Furthermore, the power semiconductor device 100 embodying the invention is capable of being built, as an inverter device, in fluid stirring or flowing equipment, such as laundry machines or fluid circulation apparatus or else by way of example. In this case also, it is possible to offer advantages, such as the reduction of power consumption and others.

While this invention has been particularly shown and described with reference to illustrative embodiments, it will be readily understood that the invention should not be limited to these embodiments and is modifiable and alterable within the scope of the invention without departing from combinations of respective embodiments and effects thereof.

The invention claimed is:

1. A semiconductor device comprising:
a semiconductor element having main current input/output electrodes with one and a remaining one thereof being take up to a one surface and a remaining surface of said semiconductor element respectively for causing one of said input/output electrodes to be contacted with a conductive layer of an insulating substrate to thereby support said semiconductor element at said insulating substrate;
a conductive strip comprised of a composite material of either carbon and aluminum or carbon and copper adapted to be used for connection between the remaining input/output electrode of said semiconductor element and the conductive layer of said insulating substrate; and
first and second contact layers each comprised of a solid solution of a mixture of two or more kinds of metal particles wherein each kind of metal particle is in nanometer order size and micron order size as selected from materials of gold, silver, nickel, copper, aluminum, zinc, tin, indium, bismuth, antimony, wherein
a surface of said first contact layer is fixedly contacted to said conductive strip and another surface of said first contact layer is fixedly contacted to the remaining input/output electrode of said semiconductor element, and wherein
a surface of said second contact layer is fixedly contacted to said conductive strip and another surface of said second contact layer is fixedly contacted to the conductive layer of said insulating substrate.

2. The semiconductor device according to claim 1, further comprising a third contact layer comprised of a solid solution of a mixture of more than one kind of metal particles wherein each kind of metal particle is in nanometer order size and micron order size as selected from materials of gold, silver, nickel, copper, aluminum, zinc, tin, indium, bismuth and antimony, wherein
a surface of said third contact layer is fixedly contacted to one of said input/output electrodes of said semiconductor element, and another surface of said third contact layer is fixedly contacted to the conductive layer of said insulating substrate.

3. The semiconductor device according to claim 1, wherein said conductive strip has a contact surface covered with gold or silver.

4. The semiconductor device according to claim 1, wherein a contact surface of one of said input/output electrodes and a contact surface of the conductive layer of said insulating substrate are covered with gold or silver.

5. A power conversion device having therein the semiconductor device as recited in claim 1.

6. A hybrid vehicle having in an engine room the power conversion device defined in claim 5.

7. A semiconductor device according to claim 1, wherein said conductive strip has a mixture of carbon and aluminum or carbon and copper such that said conductive strip has a thermal expansion coefficient of 8 to 12 ppm/° C.

8. A semiconductor device according to claim 7, wherein the thermal expansion coefficients of the conductive layer and the insulating substrate are about 10 ppm/° C.

* * * * *